(12) United States Patent
Sun

(10) Patent No.: US 10,446,590 B2
(45) Date of Patent: Oct. 15, 2019

(54) THIN FILM TRANSISTOR AND METHOD FOR MANUFACTURING THE SAME, ARRAY SUBSTRATE, AND ELECTRONIC APPARATUS

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/969,250

(22) Filed: May 2, 2018

(65) Prior Publication Data

US 2018/0254292 A1 Sep. 6, 2018

Related U.S. Application Data

(62) Division of application No. 14/360,329, filed as application No. PCT/CN2013/081009 on Aug. 7, 2013, now Pat. No. 9,991,294.

(30) Foreign Application Priority Data

Apr. 23, 2013 (CN) .......................... 2013 1 0143732

(51) Int. Cl.
*H01L 29/786* (2006.01)
*H01L 27/12* (2006.01)
(Continued)

(52) U.S. Cl.
CPC ........ *H01L 27/127* (2013.01); *H01L 21/0273* (2013.01); *H01L 27/1222* (2013.01);
(Continued)

(58) Field of Classification Search
CPC .................................................. H01L 29/78696
(Continued)

(56) References Cited

U.S. PATENT DOCUMENTS

2002/0180898 A1 12/2002 Yoo et al.
2004/0055892 A1 3/2004 Oh et al.
(Continued)

FOREIGN PATENT DOCUMENTS

CN 1372336 A 10/2002
CN 1871378 A 11/2006
(Continued)

OTHER PUBLICATIONS

The First Chinese Office Action dated Apr. 3, 2015; Appln. No. 201310143732.1.
(Continued)

*Primary Examiner* — Hsin Yi Hsieh

(57) ABSTRACT

A thin film transistor and a method for manufacturing the same, an array substrate including the thin film transistor, and an electronic apparatus including the thin film transistor or provided with the array substrate. The thin film transistor includes: a gate electrode, a gate insulating layer, an active layer, and a source electrode and a drain electrode, the active layer is formed of a mixture including a semiconductor nano-material and a photoresist material. The method for manufacturing the thin film transistor includes: preparing a mixture including a semiconductor nano-material and a photoresist material; applying the mixture over a substrate, and forming a patterned active layer by exposure and development.

8 Claims, 2 Drawing Sheets

(51) Int. Cl.
   *H01L 29/26* (2006.01)
   *H01L 29/66* (2006.01)
   *H01L 21/027* (2006.01)
   *H01L 21/02* (2006.01)

(52) U.S. Cl.
   CPC ........ *H01L 29/26* (2013.01); *H01L 29/66742* (2013.01); *H01L 29/786* (2013.01); *H01L 29/7869* (2013.01); *H01L 29/78603* (2013.01); *H01L 29/78681* (2013.01); *H01L 29/78684* (2013.01); *H01L 29/78696* (2013.01); *H01L 21/02521* (2013.01); *H01L 21/02527* (2013.01); *H01L 21/02601* (2013.01); *H01L 21/02603* (2013.01); *H01L 21/02628* (2013.01)

(58) Field of Classification Search
   USPC ....................................................... 438/151
   See application file for complete search history.

(56) References Cited

U.S. PATENT DOCUMENTS

| | | |
|---|---|---|
| 2004/0099438 A1 | 5/2004 | Arthur et al. |
| 2005/0221530 A1 | 10/2005 | Cheng et al. |
| 2006/0284181 A1 | 12/2006 | Chae et al. |
| 2008/0035912 A1* | 2/2008 | Takeuchi ............... B82Y 10/00 257/40 |
| 2009/0032890 A1 | 2/2009 | Herman et al. |
| 2009/0101895 A1 | 4/2009 | Kawamura et al. |
| 2009/0121216 A9 | 5/2009 | Han et al. |
| 2011/0058116 A1 | 3/2011 | Yamazaki et al. |
| 2012/0104328 A1 | 5/2012 | Park et al. |
| 2013/0037781 A1 | 2/2013 | Endoh |

FOREIGN PATENT DOCUMENTS

| | | |
|---|---|---|
| CN | 1885509 A | 12/2006 |
| CN | 102135729 A | 7/2011 |

OTHER PUBLICATIONS

Second Chinese Office Action dated Nov. 26, 2015; Appln. No. 201310143732.1.
The Third Chinese Office Action dated May 4, 2016; Appln. No. 201310143732.1.
The International Preliminary Report on Patentability dated Oct. 27, 2015; PCT/CN2013/081009.
The International Search Report dated Jan. 23, 2014; PCT/CN2013/081009.
USPTO RR dated Jul. 23, 2015 in connection with U.S. Appl. No. 14/360,329.
USPTO NFOA dated Oct. 6, 2015 in connection with U.S. Appl. No. 14/360,329.
USPTO NFOA dated Apr. 21, 2016 in connection with U.S. Appl. No. 14/360,329.
USPTO FOA dated Nov. 17, 2016 in connection with U.S. Appl. No. 14/360,329.
USPTO AA dated Feb. 8, 2017 in connection with U.S. Appl. No. 14/360,329.
USPTO NFOA dated Mar. 23, 2017 in connection with U.S. Appl. No. 14/360,329.
USPTO FOA dated Sep. 26, 2017 in connection with U.S. Appl. No. 14/360,329.
USPTO NOA dated Jan. 18, 2018 in connection with U.S. Appl. No. 14/360,329.
USPTO Corrected NOA dated Feb. 8, 2018 in connection with U.S. Appl. No. 14/360,329.

* cited by examiner

THIN FILM TRANSISTOR AND METHOD FOR MANUFACTURING THE SAME, ARRAY SUBSTRATE, AND ELECTRONIC APPARATUS

FIELD OF THE INVENTION

Embodiments of the present invention relate to a thin film transistor and a method for manufacturing the same, an array substrate including the thin film transistor, and an electronic apparatus including the thin film transistor or provided with the array substrate.

BACKGROUND

As the displaying technology has been developing at a high speed, thin film transistor liquid crystal display (TFT-LCD) has dominated the field of the flat panel display. The TFT-LCD is also called Active Matrix Liquid Crystal Display (AMLCD). The TFT-LCD includes a plurality of pixel units, and each of the pixel units is provided with a thin film transistor (TFT) for controlling displaying of the pixel units. Further, the display devices such as an active matrix/organic light emitting diode (AMOLED) or the like and electronic apparatuses provided with X-ray detector also need a thin film transistor to achieve their functions.

On the other hand, semiconductor nano-materials, such as semiconductor nano-wire, semiconductor carbon nanotube, semiconductor grapheme, and the like, have advantages of low manufacturing cost, scale production, and the like; furthermore, it is a semiconductor per se, if it is applied in the TFT-LCD as an active layer of the TFT, the producing cost of TFT-LCD can be reduced remarkably. However, the semiconductor nano-material has a small size, for example, in general, nano-wire has a width less than 100 nm, for another example, a grapheme has a size of about 1 µm, which is difficult to be arranged on the array substrate in order. Nano-imprint or electric field distribution is not applicable in the scale production of the TFT-LCD due to high processing cost. Therefore, it is difficult to apply the semiconductor nano-material in the TFT-LCD to reduce producing cost of the TFT-LCD in the prior arts.

SUMMARY

According to embodiments of the present invention, a thin film transistor and a method for manufacturing the same, an array substrate including the thin film transistor, and an electronic apparatus including the thin film transistor or provided with the array substrate, are provided, thereby resolving the technical problem that it is difficult to apply semiconductor nano-material to the display field.

To attain the object described above, the embodiments of the present invention adopt the following technical solutions:

According to an embodiment of the present invention, there is provided a thin film transistor, comprising a gate electrode, a gate insulating layer, an active layer, a source electrode and a drain electrode, wherein, the active layer is formed of a mixture including a semiconductor nano-material and a photoresist material.

In one example, the semiconductor nano-material comprises one or more selected from a group consisting of semiconductor nano-wire, semiconductor carbon nanotube and semiconductor nanoscale graphene.

In one example, the semiconductor nano-wire material is one or more selected from a group consisting of cadmium sulfide, zinc oxide, silicon, cadmium, gallium nitride and indium phosphide.

In one example, the photoresist material is an electron beam photoresist of polymethylmethacrylate (PMMA) or a photosensitive polyimide (PI).

In one example, the mixture further includes a solvent, and the semiconductor nano-material has a content of 1 mg/mL to 50 mg/mL, preferably 5 mg/mL to 30 mg/mL, more preferably 10 mg/mL to 20 mg/mL, in the mixture.

In one example, a mass ratio between the semiconductor nano-material and the photoresist material is 1:5 to 1:250, preferably 1:25 to 1:150, more preferably 1:50 to 1:100.

In one example, the thin film transistor is a bottom gate type thin film transistor.

In one example, the gate insulating layer is located above the gate electrode, the source electrode and the drain electrode are located above the gate insulating layer and disposed on both sides of the gate electrode, and the active layer is located above the source electrode, the drain electrode and the gate insulating layer.

In one example, the active layer has a flat surface.

Another embodiment of the invention provides an array substrate comprising the thin film transistor as mentioned above.

In one example, the array substrate comprises a base substrate, and the thin film transistor is provided on the base substrate.

In one example, the array substrate further comprises a pixel electrode provided above the base substrate, and the pixel electrode is electrically connected with a drain electrode of the thin film transistor.

In one example, the thin film transistor is a bottom gate type thin film transistor, the gate insulating layer is located above the gate electrode, the source electrode and the drain electrode are located above the gate insulating layer and disposed on both sides of the gate electrode, and the active layer is located above the source electrode, the drain electrode and the gate insulating layer, and the pixel electrode is disposed directly on the active layer. In this case, the pixel electrode is electrically connected with the drain electrode through the active layer.

In one example, the array substrate further comprises a pixel defining layer disposed on the gate insulating layer, and the pixel defining layer is located around the pixel electrode.

In one example, a via hole is provided in the gate insulating layer, a part of the pattern of the gate layer is connected to a part of the pattern of the source-drain layer through the via hole.

Another embodiment of the invention provides an electronic apparatus comprising the above thin film transistor or the above array substrate.

Another embodiment of the invention provides a method for manufacturing a thin film transistor, comprising:

preparing a mixture including a semiconductor nano-material and a photoresist material;

applying the mixture over a substrate, and forming a patterned active layer by exposure and development.

Preparing the mixture comprises:

mixing the semiconductor nano-material and the photoresist material with a solvent, and making a homogeneous mixture by stirring or ultrasonic;

or, dispersing the semiconductor nano-material in solvent in advance, and then, mixing uniformly the solvent mixed with the photoresist material.

Comparing to prior arts, the technical solutions provided according the embodiments of the present invention described above have following advantage: patterned active layer is obtained by mixing the semiconductor nano-material and the photoresist material, to disperse uniformly the nano-material in the photoresist material, by applying the mixture on the substrate, and by exposing and developing. The semiconductor nano-material in the active layer can be connected each other to form a plurality of electrical path. Therefore, according the present invention, the semiconductor nano-material can be used as an active layer of a thin film transistor performed in simple and easy manner, thereby reducing producing cost of the TFT-LCD.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
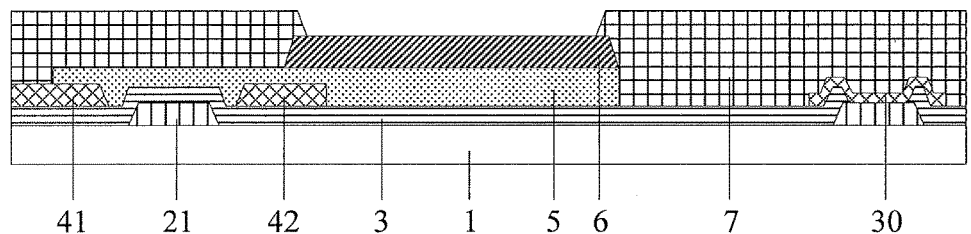
FIG. 1 is a schematic view of a thin film transistor provided according to an embodiment of the invention in an array substrate.

A thin film transistor (TFT) provided according to the present invention may be applied to an array substrate of AMLCD or AMOLED, the thin film transistor may be a top gate type, a bottom gate type, etching stop type, back channel etch type, coplanar type, or any other structural type. In the embodiments of the present invention, description is made by take the bottom gate type thin film transistor as an example. As illustrated in FIG. 1, the TFT comprises a gate electrode 21, a gate insulating layer 3, an active layer 5, a source electrode 41, and a drain electrode 42, disposed on a base substrate 1. The active layer 5 is formed of a mixture including a semiconductor nano-material and a photoresist material. The semiconductor nano-material is, for example, one or more selected from a group consisting of a semiconductor nano-wire, a carbon nanotube, and a semiconductor nanoscale graphene. If the semiconductor nano-wire is used, it may be one or more selected from a group consisting of cadmium sulfide, zinc oxide, silicon, cadmium, gallium nitride, indium phosphide. The photoresist material is, for example, an electron beam photoresist of polymethylmethacrylate (PMMA) or a photosensitive polyimide (PI).

Specifically, the mixture used in an embodiment of the present invention is prepared by mixing the semiconductor nano-material in a liquid photoresist material at some concentration ratio, and dispersing uniformly the semiconductor nano-material in the photoresist material by applying a high power ultrasonic on or stirring the photoresist material mixed with the semiconductor nano-material. Before the semiconductor nano-material is mixed in the photoresist material, the semiconductor nano-material may be diluted by using organic solvent, such as, benzene, ethanol, acetone, or the like, and then may be mixed in the photoresist material to be stirred, so that it is easy to disperse the nano-material uniformly in the photoresist material. Content of the semiconductor nano-material in the mixture is, preferably from 1 mg/mL to 50 mg/mL; more preferably from 5 mg/mL to 30 mg/mL; most preferably from 10 mg/mL to 20 mg/m L. After the active layer is formed of the mixture, the mass ratio of the semiconductor nano-material to photoresist material is from 1:5 to 1:250, preferably from 1:25 to 1:150, more preferably from 1:50 to 1:100.

The semiconductor nano-material, such as carbon nanotube, is dispersed in organic solvent, such as ethanol, and is mixed uniformly, and the organic solvent mixed with the semiconductor nano-material is added into liquid phase photoresist material, such as PMMA. By ultrasonic treatment for 10 to 60 minutes, the components are mixed uniformly. The mixture including the semiconductor nano-material and photoresist material is applied on a substrate to form an active thin film layer, then an exposure process is performed on the substrate. In the embodiment of the invention, an electron beam positive photoresist of PMMA is adopted, and it is exposed by an electron beam. The film in the region exposed to the electronic beam is removed by developing process, and the film in the un-exposed region is retained, i.e., a patterned active layer is formed. If other photoresist materials are used, the exposing manner, for example, such as ultraviolet radiation exposing, may be selected according to the property of the photoresist material.

According to another embodiment of the present invention, there is provided an array substrate, including a base substrate 1, and a pixel electrode 6 and the TFT as described above disposed on the base substrate 1. As illustrated in FIG. 1, an active layer 5 formed of a mixture of semiconductor nano-material and photoresist material in the TFT is disposed on a gate insulating layer 3, the left part of the active layer 5 in FIG. 1 is covered on the source electrode 41 and the drain electrode 42 of the TFT, i.e., as the active layer of the TFT. Meanwhile, the pixel electrode 6 is disposed on the right part of the active layer 5 in FIG. 1, the active layer 5 formed of the mixture of the semiconductor nano-material and photoresist material has a flat surface, and thus, a planarization layer can be omitted, so that the pixel electrode 6 is disposed directly on the active layer 5. Further, since the active layer 5 is conductive per se, and electrical connection between the drain electrode 42 and the pixel electrode 6 can be achieved, the step for etching a via hole in an insulating planarization layer in prior arts can be omitted.

That is to say, the active layer according to the embodiment of the present invention may have a flat surface, and thus, it has the function of a planarization layer per se.

Furthermore, the array substrate further includes a pixel defining layer (PDL) 7 on the gate insulating layer 3, the pixel defining layer 7 is located around the pixel electrode 6, to defined a region of pixel units, and thus, the array substrate in the embodiments of the present invention can be applied to AMOLED.

Alternatively, a via hole 30 may be disposed in the gate insulating layer 3, a part of the gate layer pattern and a part of the source-drain layer pattern may be connected by the via hole. When a circuit design on an array substrate is complicated, phenomena that a plurality of electrical conduct layers are arranged in cross are appeared. In the embodiments of the present invention, the gate layer pattern and a part of the source-drain layer are used as a conductive line, and the electrical connection is created by the via hole 30 in the gate insulating layer 3, thereby reducing the layer number of conductive lines, and simplifying manufacturing process of the array substrate.

Figure 2A:
FIGS. 2a to 2f are schematic views of a manufacturing process of an array substrate provided according to an embodiment of the present invention including thin film transistors.

According to still another embodiment of the present invention, there is provided a method for manufacturing an array substrate, including:

S1: as illustrated in FIG. 2a, a gate layer pattern is formed on a base substrate 1, and the gate layer pattern includes a gate electrode 21.

Specifically, a gate layer is deposited on a base substrate 1, and then, a layer of photoresist is coated on the gate layer, after the process of exposing and developing, a gate layer pattern is formed by wet etching, and removing the rest of the photoresist, finally, the gate layer pattern including a gate line (not illustrated in the drawings) and the gate electrode 21 is formed.

S2: a gate insulating layer is formed on the substrate.

Figure 2B:
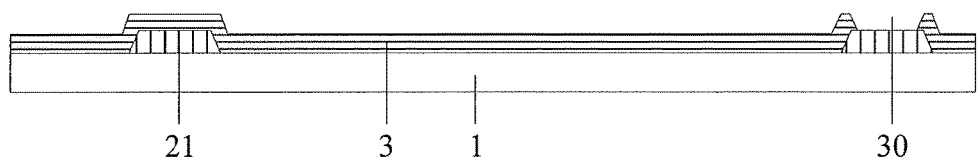

S3: as illustrated in FIG. 2b, by a patterning process, a via hole 30 is formed in the gate insulating layer 3.

Thus, a part of a source-drain layer pattern to be formed subsequently and a part of the gate layer pattern can be connected by the via hole 30, thereby reducing layer number of conductive lines, and simplifying manufacturing process of the array substrate.

Of course, the present step S3 is an optional step, in the case that circuit design on the array substrate is simple per se, the present step S3 can be omitted.

Figure 2C:
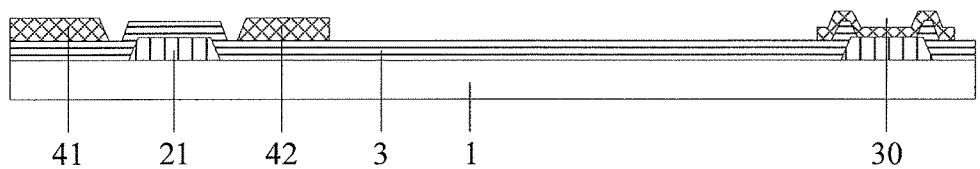

S4: as illustrated in FIG. 2c, a source-drain layer pattern is formed on the substrate, the source-drain layer pattern include a source electrode and a drain electrode.

Specifically, a source-drain layer is deposited on the substrate, and then, a layer of photoresist is coated on the source-drain layer, after the processes of exposing, developing, and the like, the source-drain layer pattern is formed by using wet etch, and by removing the rest photoresist, the source-drain layer pattern including a data line (not illustrated in the drawings), the source electrode 41, and the drain electrode 42 is finally formed, in which the source electrode 41 and the drain electrode 42 are located on both sides of the gate electrode 21.

Figure 2D:
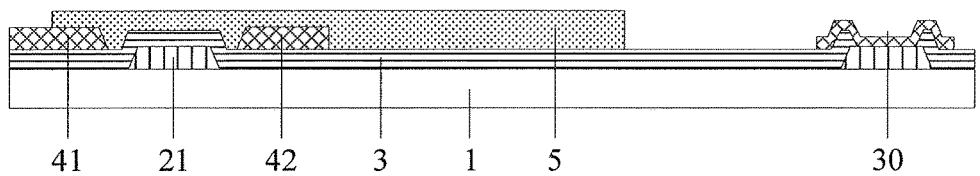

S5: as illustrated in FIG. 2d, an active layer 5 is formed on the substrate.

First, a mixture including a semiconductor nano-material and a photoresist material is prepared. Specifically, mixing the semiconductor nano-material and the photoresist material with a solvent, and making a homogeneous mixture by stirring or ultrasonic; or, dispersing the semiconductor nano-material in solvent in advance, and then, mixing uniformly the solvent mixed with the photoresist material.

Then, the prepared mixture is applied on the substrate, after exposing, developing, and the like, patterned active layer 5 is formed, and the active layer 5 is covered on the source electrode 41 and the drain electrode 42.

Figure 2E:
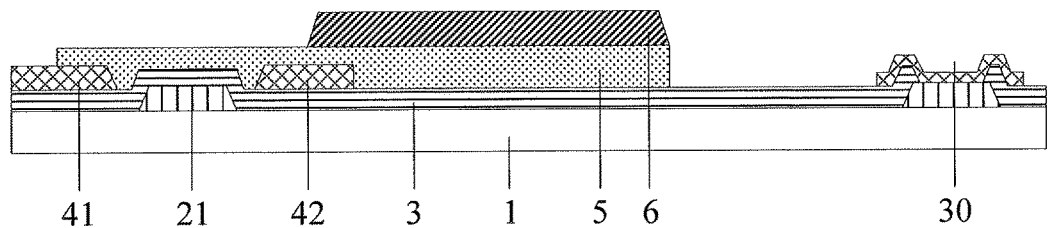

S6: as illustrated in FIG. 2e, a transparent electrode layer pattern including a pixel electrode 6 is formed on the active layer 5.

Specifically, the transparent electrode layer is deposited on the substrate by using a sputtering technology, the material of the transparent electrode layer is preferably indium tin oxide (ITO), then, a layer of photoresist is applied on the transparent electrode layer, after exposing, developing, and the like, the transparent electrode layer pattern including the pixel electrode 6 is formed by using wet etching, and removing the rest photoresist, finally, the formed pixel electrode 6 is located on the right part of the active layer 5.

The surface of the active layer 5 formed of the mixture of the semiconductor nano-material and photoresist material is a flat surface, and therefore, a planarization layer can be omitted, and the pixel electrode 6 can be disposed directly on the active layer 5. furthermore, since the active layer 5 may be conductive per se, and the electrical connection between the drain electrode 42 and the pixel electrode 6 can be achieved, the step for forming a via hole in insulating planarization layer in the prior arts is omitted.

Preferably, in the steps S4 and S6 described above, the source-drain layer and the transparent electrode layer may be wet-etched by selecting the same etching solution, and the etching solution should have a etching selectivity as high as possible to the transparent electrode layer and the source-drain layer, so that the transparent electrode layer is etched rapidly in the step S6, without influencing original pattern of the source-drain layer. In this way, the same etching solution can be applied in both the steps S4 and S6, thereby simplifying the selecting of the etching solution.

Figure 2F:
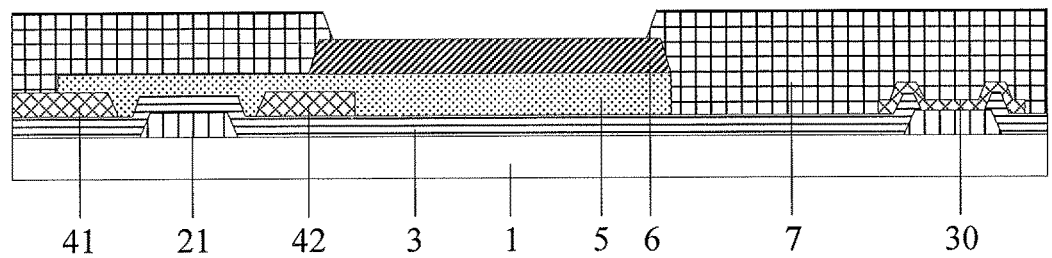

After the transparent electrode layer pattern including the pixel electrode 6 is formed on the active layer 5, the method may further include:

S7: as illustrated in FIG. 2f, a pixel defining layer (PDL) 7 is formed on the substrate.

Specifically, a thin film for the pixel defining layer is formed on the substrate, after exposing, developing, and the like, the pixel defining layer 7 is obtained, after drying and solidification process, the pixel defining layer 7 located around the pixel electrode 6 may be formed, to define regions of the pixel units.

Figure 3:
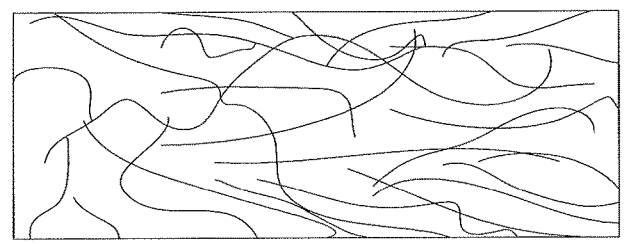
FIG. 3 is a schematic view of an active layer in a thin film transistor provided according to an embodiment of the present invention.

In the array substrate and the method for manufacturing the same provided according to the embodiments of the present invention, the semiconductor nano-material and the photoresist material are mixed, so that the semiconductor nano-material is dispersed uniformly in the photoresist material, and the mixture is applied on the array substrate to form a thin film, after exposing, developing, and the like, the patterned active layer is formed. The semiconductor nano-material in the active layer can be connected together, as illustrated in FIG. 3, the semiconductor nano-material may be connected in irregular curve manner, in order to form a plurality of electrical conductive paths, to act as the active layer in the TFT. Therefore, the semiconductor nano-material as the active layer in the TFT can be performed in simple and easy manner in the embodiments of the present invention, thereby reducing the cost of production of the TFT-LCD.

As described above, the thin film transistor and the method for manufacturing the same according to the embodiments of the present invention have been described taking a bottom gate type thin film transistor as an example, however, the present invention is not limited to the bottom gate type thin film transistor. For other types of thin film transistor, any suitable position relations of the gate electrode, the gate insulating layer, the active layer, the source electrode and drain electrode and the forming sequence for manufacturing process may be adopted.

For example, in the case of the bottom gate type thin film transistor, the position relations of different layers can adopt the following ways: the gate insulating layer is located above the gate electrode, the source electrode and the drain electrode are located above the gate insulating layer and disposed on both sides of the gate electrode, the active layer is located above the source electrode and the drain electrode, and above the gate insulating layer. In the case of the bottom gate type thin film transistor used for the array substrate, the pixel electrode may be disposed directly on the active layer, thereby omitting a planarization layer.

According to further embodiment of the present invention, there is provided an electronic apparatus, including the TFT and the array substrate according to the embodiments of the present invention described above, the electronic apparatus may be any products or components having a display function, such as, a liquid crystal panel, an electronic paper, an OLED panel, a liquid crystal TV, a liquid crystal display, a digital camera, a mobile telephone, and a flat computer, or it may be an electronic apparatus such as a X-ray detector.

Since the electronic apparatus provided according to the embodiments of the present invention has the same technical features with the TFT and the array substrate provided according to the embodiments invention as described above, the same technical effects can be obtained, and the same technical problems can be resolved.

The foregoing is merely exemplary embodiments of the invention, but is not used to limit the protection scope of the invention. The protection scope of the invention shall be defined by the attached claims.

What is claimed is:

1. A method for manufacturing a thin film transistor, comprising:
   preparing a mixture including a semiconductor nano-material and a photoresist material, wherein the mixture is prepared by mixing the semiconductor nano-material in the photoresist material; and
   applying the mixture over a substrate, and forming a patterned active layer by exposure and development,
   wherein the semiconductor nano-material is directly connected in an irregular curve manner.

2. The method according to claim 1, wherein, preparing the mixture comprises:
   mixing the semiconductor nano-material and the photoresist material with a solvent, and making a homogeneous mixture by stirring or ultrasonic;
   or, dispersing the semiconductor nano-material in the solvent in advance, and then, mixing uniformly the solvent mixed with the photoresist material.

3. The method according to claim 2, wherein, the photoresist material is an electron beam photoresist of polymethylmethacrylate or a photosensitive polyimide.

4. The method according to claim 1, wherein, the photoresist material is an electron beam photoresist of polymethylmethacrylate or a photosensitive polyimide.

5. The method according to claim 4, wherein, a mass ratio between the semiconductor nano-material and the photoresist material is 1:5 to 1:250.

6. The method according to claim 1, wherein, a mass ratio between the semiconductor nano-material and the photoresist material is 1:5 to 1:250.

7. The method according to claim 2, wherein, a mass ratio between the semiconductor nano-material and the photoresist material is 1:5 to 1:250.

8. The method according to claim 3, wherein, a mass ratio between the semiconductor nano-material and the photoresist material is 1:5 to 1:250.

* * * * *